United States Patent
Huang et al.

(10) Patent No.: US 6,262,451 B1
(45) Date of Patent: Jul. 17, 2001

(54) ELECTRODE STRUCTURE FOR TRANSISTORS, NON-VOLATILE MEMORIES AND THE LIKE

(75) Inventors: Jenn-Hwa Huang, Gilbert; Kurt Eisenbeiser, Tempe; Yang Wang; Ellen Lan, both of Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/816,707

(22) Filed: Mar. 13, 1997

(51) Int. Cl.$^7$ .................................................. H01L 29/788
(52) U.S. Cl. ...................... 257/315; 257/295; 257/303; 257/336; 257/340; 257/344; 257/408; 257/524; 257/547; 257/900
(58) Field of Search ..................... 257/295, 303, 257/336, 340, 344, 408, 900, 524, 547, 315

(56) References Cited

U.S. PATENT DOCUMENTS

| 5,108,939 | | 4/1992 | Manley et al. ........................ 437/43 |
| 5,413,948 | * | 5/1995 | Pfiester et al. ........................ 437/41 |
| 5,494,838 | * | 2/1996 | Chang et al. .......................... 437/43 |
| 5,543,643 | | 8/1996 | Kapoor ................................ 257/262 |
| 5,599,726 | | 2/1997 | Pan ...................................... 437/41 |
| 5,663,586 | * | 9/1997 | Lin ..................................... 257/336 |
| 5,760,435 | * | 6/1998 | Pan .................................... 257/314 |
| 5,825,609 | * | 10/1998 | Andricacos et al. .................. 257/295 |

FOREIGN PATENT DOCUMENTS

| 0329047 | 2/1989 | (EP) | ............................. H01L/29/60 |
| 0335395 | 3/1989 | (EP) | ............................. H01L/29/78 |

* cited by examiner

*Primary Examiner*—Eddie Lee
*Assistant Examiner*—Matthew E. Warren
(74) *Attorney, Agent, or Firm*—Eugene A. Parsons; William E. Koch; Lanny L. Parker

(57) ABSTRACT

An electrode structure for semiconductor devices includes first electrode material positioned in overlying relationship to the surface of a substrate so as to define a first side wall perpendicular thereto. A nonconductive side wall spacer is formed on the first side wall and defines a second side wall parallel to and spaced from the first side wall. Second electrode material is formed in overlying relationship to the substrate and on the second side wall so as to define a third side wall parallel to and spaced from the second side wall. The first and second electrode materials are connected as first and second electrodes in a common semiconductor device. Additional electrodes can be formed by forming electrode material on additional side walls.

12 Claims, 3 Drawing Sheets

ELECTRODE STRUCTURE FOR TRANSISTORS, NON-VOLATILE MEMORIES AND THE LIKE

FIELD OF THE INVENTION

The present invention pertains to novel contact electrode and gate structures and more specifically to very small dimension contact electrode and gate structures for the fabrication of novel semiconductor devices.

BACKGROUND OF THE INVENTION

In the semiconductor industry, devices are becoming smaller and components, e.g. control electrodes, contact electrodes, gates, etc., within the devices are so small they are very difficult to fabricate. Side wall spacers have found some limited use in various manufacturing processes. The most typical application of side wall spacers is to space heavily doped regions away from the gate electrode of a transistor via the so called "self-aligned" implant process. In this process a gate is formed and side wall spacers are formed on the sides of the gate. The source and drain are then implanted using the gate and side wall spacers as an implant mask. The heavily doped source and drain regions are spaced from the gate by the width of the side wall spacers, which is determined by the thickness of the side wall spacer material deposited before directional etching. The device breakdown voltage is thus improved.

It would be highly desirable to utilize side wall spacers in the fabrication of additional semiconductor devices.

It is a purpose of the present invention to provide a new and improved electrode structure for semiconductor devices.

It is another purpose of the present invention to provide a new and improved electrode structure for new and improved semiconductor devices.

It is a further purpose of the present invention to provide a new and improved electrode structure for semiconductor devices which is easy to fabricate and which is useful in the fabrication of multiple threshold voltage transistors, memory devices, etc.

SUMMARY OF THE INVENTION

The above problems and others are at least partially solved and the above purposes and others are realized in an electrode structure, e.g. a source, drain, or gate, for semiconductor devices fabricated in accordance with the present invention. In a typical example of the fabrication of an electrode structure, first electrode material is positioned in overlying relationship to the surface of a substrate so as to define a first side wall perpendicular thereto. A nonconductive side wall spacer is formed on the first side wall and defines a second side wall parallel to and spaced from the first side wall. Second electrode material is formed in overlying relationship to the substrate and on the second side wall so as to define a third side wall parallel to and spaced from the second side wall. The first and second electrode materials are connected as first and second electrodes in a common semiconductor device. Additional electrodes can be formed by forming electrode material on additional side walls.

In another embodiment, the first and second electrode materials are formed on a gate dielectric, which is formed on the surface of the substrate. The gate dielectric for the first and second gates may be the same material and thickness or it may be different material and/or different thicknesses to form a multiple threshold transistor.

The novel electrode structure may be utilized to form novel memory devices. Also, as will be understood by those skilled in the art, the electrode fabrication steps can be used to form various electrodes, such as sources, drains, gates, etc., and the gate description utilized herein is only for purposes of illustration and example.

BRIEF DESCRIPTION OF THE DRAWINGS

Referring to the drawings.

DESCRIPTION OF THE PREFERRED EMBODIMENTS

Figure 1:
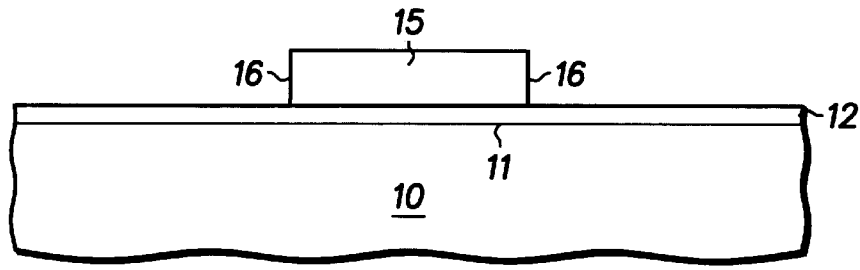
FIGS. 1–5 are greatly enlarged, simplified cross-sectional views illustrating several steps in the fabrication of a gate structure in accordance with the present invention.

Turning now to the drawings, FIGS. 1–5 are greatly enlarged, simplified cross-sectional views illustrating several steps in the fabrication of a gate structure in accordance with the present invention. As explained above, a gate structure is used herein to fully explain the invention and it will be understood by those skilled in the art that the methods and apparatus described will extend to other terminals, including sources, drains, etc. Referring specifically to FIG. 1, a substrate 10 is illustrated having an upper surface 11. Substrate 10 will generally be formed from semiconductor material, such as silicon, gallium arsenide, silicon carbide, sapphire, etc. Also, in some instances the supporting substrate may have additional layers of material formed thereon, e.g. epitaxially, and these additional layers are generally considered to be a part of the substrate and, accordingly, will not be illustrated or discussed in detail herein.

A layer 12 of gate dielectric is positioned on surface 11 of substrate 10 by some convenient procedure. Generally, the gate dielectric is a fine oxide and may be any of the materials and processes presently used in the semiconductor industry. A first gate material is positioned on gate dielectric layer 12 by any convenient process to form a gate 15. For example, substrate 10 will generally be a semiconductor wafer and gate 15 may be one of several gates formed simultaneously by utilizing a side wall forming process similar to a process to be explained with reference to FIGS. 2 and 3. Gate 15 defines spaced apart, parallel opposing first side walls 16 substantially perpendicular to surface 11 of substrate 10. Further, FIG. 1 is a cross-sectional view and it should be understood that gate 15 may simply have an elongated shape, an oval shape (the other side not shown), a serpentine shape, or any of the other shapes utilized in the semiconductor industry. Also, gate 15 may be any convenient electrode material, such as poly-silicon, metal, etc., and in this embodiment forms a metal-oxide-semiconductor (MOS) gate on semiconductor substrate 10.

Figure 2:
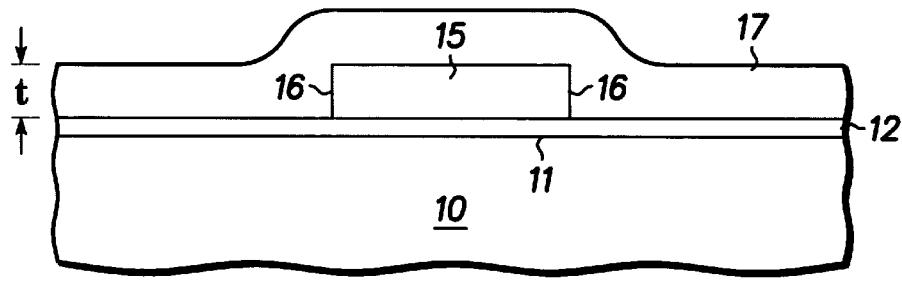
Figure 3:
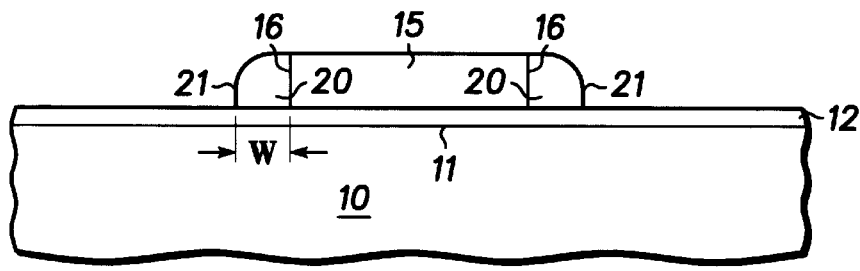

A layer 17 of non-conducting material is deposited conformally over gate 15, as illustrated in FIG. 2. In this specific embodiment layer 17 is formed of insulating material, such as $SiO_2$, $Si_3N_4$, or the like. Layer 17 is then etched by some convenient directional etching process to remove all of layer 17 except for side wall spacers 20, one on each side wall 16, as illustrated in FIG. 3. It should be noted that the width 'w' of side wall spacers 20 is approximately the same as the thickness 't' of layer 17. Further, since the thickness 't' of layer 17 can be very accurately controlled, the width 'w' of side wall spacers 20 is very accurate. Side wall spacers 20 each define a second side wall 21 substantially parallel to and spaced from first side walls 16 on gate 15.

Figure 4:
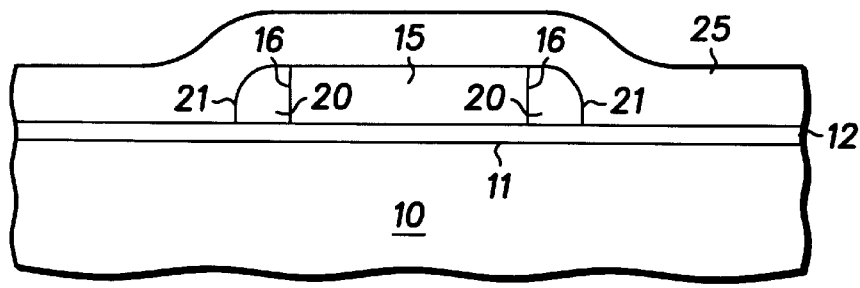

A layer 25 of second gate material is conformally deposited in overlying relationship to surface 11 of substrate 10, in this embodiment on layer 12, side wall spacers 20 and first gate 15, as illustrated in FIG. 4. Layer 25 is then directionally etched, as explained above and illustrated in FIG. 5, so as to remove all of layer 25 except for portions which define a pair of gates 26 and 27. Gates 26 and 27 also define a pair of third side walls 28 substantially parallel to and spaced from second side walls 21. As explained above, gates 26 and 27 have a thickness '$w_2$' which is substantially equal to the thickness '$t_2$' of layer 25. Further, since the thickness '$t_2$' of layer 25 can be very accurately controlled, the width '$w_2$' of gates 26 and 27 is very accurate. Generally, the width '$w_2$' of gates 26 and 27 each have a thickness in a range of approximately 0.1 –0.5 microns.

Figure 5:
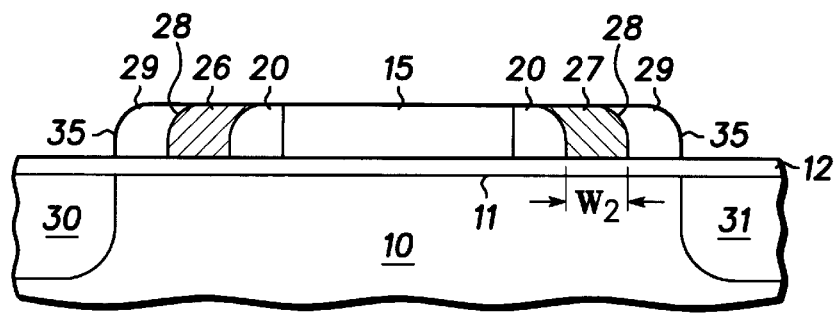

A variety of steps may be utilized to complete the semiconductor device with an example of one simplified structure being illustrated in FIG. 5. A second pair of side wall spacers 29 are formed on side walls 28 of gates 26 and 27. The entire gate structure is then used as a self-aligning mask to implant source and drain areas 30 and 31. Gates 15, 26 and 27 form one, two, or three different gates in the operation of the semiconductor device illustrated in FIG. 5. For example, the device might be used as a three input NAND gate, or a two or three gate MOSFET, etc.

Figure 6:
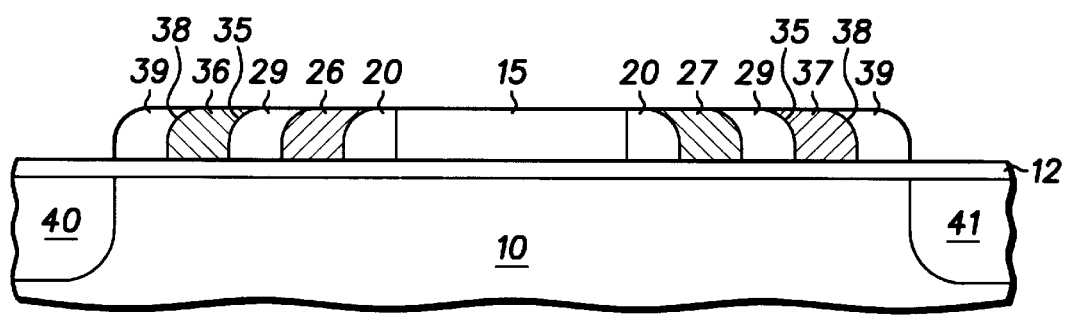
FIG. 6 is a greatly enlarged, simplified cross-sectional view of some additional steps which may be performed in the fabrication of a gate structure in accordance with the present invention.

Referring specifically to FIG. 6, a greatly enlarged, simplified cross-sectional view is illustrated of some additional steps which may be performed in the fabrication of a gate structure in accordance with the present invention. The fabrication of the device illustrated in FIG. 6 is an extension of the structure illustrated in FIG. 5 and, accordingly, similar components are designated with similar numbers for a better understanding of the continuing process. The formation of side wall spacers 29 on the side walls 28 of gates 26 and 27 defines side walls 35, as illustrated in FIG. 5. A third layer of gate material is then conformally deposited and directionally etched to define fourth and fifth gates 36 and 37. Gates 36 and 37 define side walls 38 and a third pair of side wall spacers 39 are formed on side walls 38 of gates 26 and 27. Appropriate processes can be inserted in between each side wall formation, for example, the entire gate structure can be used as a self-aligning mask to implant source and drain areas 40 and 41.

Figure 7:
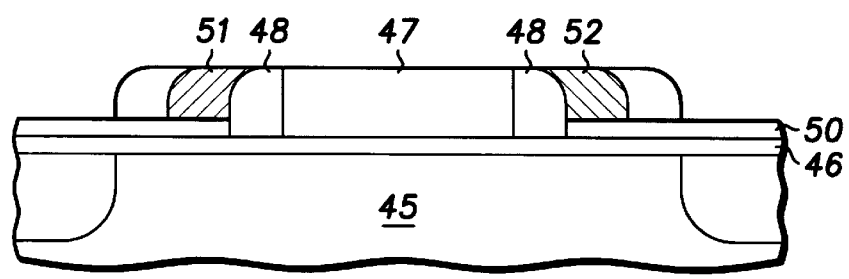
FIGS. 7, 8, and 9 are greatly enlarged, simplified cross-sectional views of three other embodiments of a gate structure in accordance with the present invention.

Turning now to FIG. 7, a greatly enlarged, simplified cross-sectional view of another embodiment of a gate structure in accordance with the present invention is illustrated. A substrate 45 has a layer 46 of gate dielectric material deposited on the surface thereof and a first gate 47, with side wall spacers 48 on either side thereof, formed on layer 46, as explained with reference to FIG. 3. In this embodiment a second layer 50 of gate dielectric material is formed on the exposed surface of layer 46 and a pair of second gates 51 and 52 are formed as explained previously, except that they are formed on the surface of second layer 50. Thus, a thicker amount of gate dielectric is positioned between substrate 45 and each of gates 51 and 51 than is positioned between substrate 45 and gate 47. This difference in thickness of the gate dielectric results in a larger activating voltage being required on each of gates 51 and 52 than is required on gate 47, resulting in a multi-threshold voltage device. In this fashion the thickness and/or material of each of the gate dielectrics can be changed to provide any desired thresholds in the device.

Figure 8:
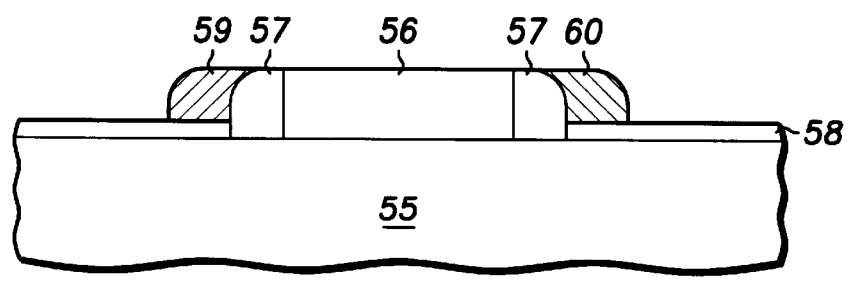

Turning now to FIG. 8, a greatly enlarged, simplified cross-sectional view of another embodiment of a gate structure in accordance with the present invention is illustrated. In this embodiment a semiconductor substrate 55 is provided and a first gate 56 is formed directly on the surface thereof. Side wall spacers 57 are formed on either side of gate 56, as previously explained. A layer 58 of gate dielectric is then formed on the exposed surface of substrate 55 and second and third gates 59 and 60 are formed on the side walls of side wall spacers 57 and on the surface of layer 58. In this embodiment, because gate 56 is formed directly on the surface of substrate 55, it can be a Schottky type gate while gates 59 and 60 are MOS type gates. It will of course be understood that all three gates could be formed as Schottky type gates by eliminating layer 58.

Figure 9:
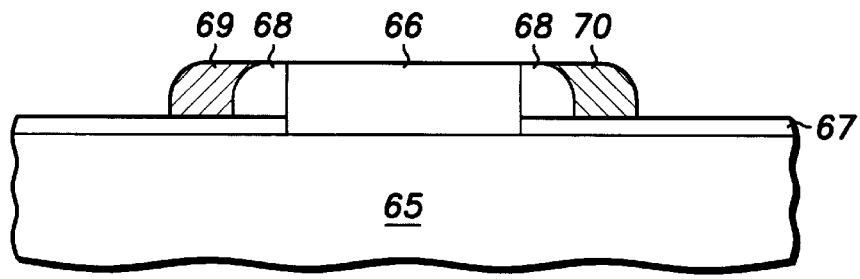

Turning now to FIG. 9, a greatly enlarged, simplified cross-sectional view of another embodiment of a gate structure in accordance with the present invention is illustrated. In this embodiment a semiconductor substrate 65 is provided and a first gate 66 is formed directly on the surface thereof. A layer 67 of gate dielectric is then formed on the exposed surface of substrate 65 and side wall spacers 68 are formed on either side of gate 66, as previously explained. The difference in this embodiment is that side wall spacers 68 are formed of ferroelectric material. Layer 67 is incorporated to insulate side wall spacers 68 of ferroelectric material from substrate 65, if needed. Second and third gates 69 and 70 are formed on the side walls of side wall spacers 68 and on the surface of layer 67. Thus, the ferroelectric material sandwiched between gate 66 and gates 69 and 70 can be utilized as a multistate memory device, logic device, etc.

Figure 10:
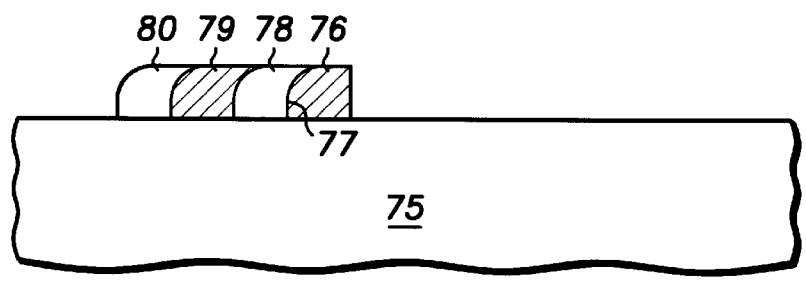
FIG. 10 is a greatly enlarged, simplified cross-sectional view of a lateral nonvolatile memory utilizing a gate structure in accordance with the present invention.

Referring specifically to FIG. 10, a greatly enlarged, simplified cross-sectional view of a lateral nonvolatile memory utilizing a gate structure in accordance with the present invention is illustrated. In this embodiment a semiconductor substrate 75 is provided and a first material 76 is positioned in overlying relationship on the surface of substrate 75. Material 76 is preferably semiconductor material formed, for example, by epitaxial growth, selective epitaxial growth, etching, side wall spacers, etc. Material 76 is formed to define a first side wall 77 substantially perpendicular to the surface of substrate 75. A side wall spacer 78 is formed on side wall 77, in this specific embodiment of an appropriate oxide. Another side wall spacer 79 is formed, in this embodiment of an appropriate nitride, using spacer 78 as a side wall. A metal layer 80 is formed, using spacer 79 as a side wall, to complete a lateral Metal-Nitride-Oxide-Semiconductor (MNOS) nonvolatile memory.

Figure 11:
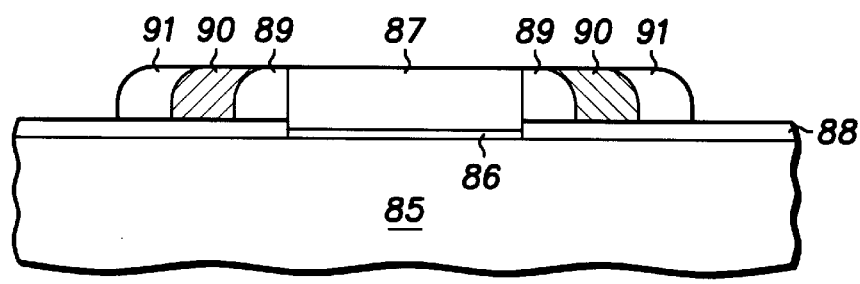
FIG. 11 is a greatly enlarged, simplified cross-sectional view of another embodiment of a lateral nonvolatile memory utilizing a gate structure in accordance with the present invention.

Turning to FIG. 11, a greatly enlarged, simplified cross-sectional view of another embodiment of a lateral nonvolatile memory utilizing a gate structure in accordance with the present invention is illustrated. In this structure a semiconductor substrate 85 is provided and a gate oxide layer 86 is formed on the surface thereof with a gate 87 positioned thereon, as explained above. A thicker isolation layer 88 of oxide or the like is formed on the exposed surface of substrate 85 and first side wall spacers 89 are formed on layer 88 and the side walls of gate 87, as explained above. Side wall spacers 89 are formed of a compatible oxide. Side wall spacers 90, formed of a compatible nitride, are formed on layer 88 and the side walls of spacers 89, as explained above. Metal contacts 91 are formed on layer 88 and the side walls of spacers 90, as explained above. Appropriate source and drain terminals are formed in substrate 85 in accordance with semiconductor processes to complete an MNOMOS transistor.

Figure 12:
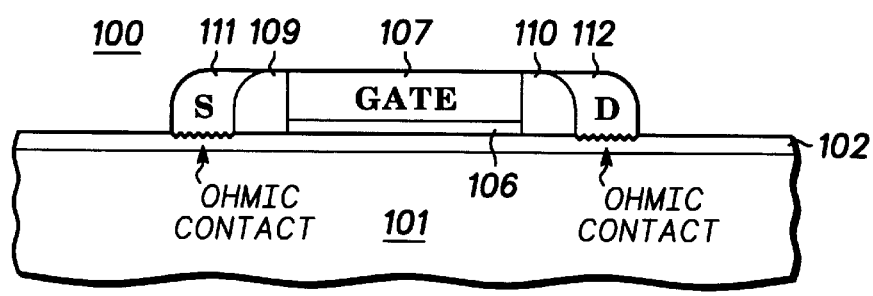
FIG. 12 is a greatly enlarged, simplified cross-sectional view of a complete semiconductor device in accordance with the present invention.

Referring specifically to FIG. 12, a complete transistor 100 is illustrated in accordance with the present invention. Transistor 100 includes a substrate 101 with a channel layer 102 formed adjacent the upper surface thereof by some convenient method, such as diffusion, implanting, epitaxial growth or the like. A gate oxide layer 106 is formed on the surface of channel layer 102 with a gate 107 positioned thereon, as explained above. Side wall spacers 109 and 110 are formed of a compatible oxide on opposite sides of gate 107. A source electrode 111 is then formed on side wall spacer 109 and a drain electrode 112 is formed on side wall spacer 110. In actual practice, source and drain electrodes 111 and 112 are formed in a single metal deposition process, which metal forms ohmic contacts with channel layer 102. It can be seen from this example that other devices may be fabricated with minor adjustments to the process.

Accordingly, a new and improved gate structure for semiconductor devices has been disclosed and several embodiments of semiconductor devices using the novel gate structure have been disclosed. Further, from this disclosure it will be understood that other side wall structures can be formed by utilizing physically, chemically, electrically, or magnetically different materials. The new and improved gate structure for semiconductor devices is easy to fabricate and is useful in the fabrication of many different types of multiple threshold voltage transistors, memory devices, etc. To further extend the capability of this invention, a complete transistor (or other semiconductor device) can be formed using side wall gate (control electrode) and side wall ohmic contacts (contact electrodes).

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An electrode structure for a multi-threshold voltage device comprising:

a semiconductor substrate having a surface;

a first electrode material positioned in overlying relationship on the surface of the substrate and defining a first side wall substantially perpendicular to the surface of the substrate;

a first nonconductive side wall spacer formed on the first side wall and defining a second side wall substantially parallel to and spaced from the first side wall;

a second electrode material formed in overlying relationship to the surface of the substrate and formed on the second side wall so as to define a third side wall substantially parallel to and spaced from the second side wall, the first and second electrode materials being electrically connected as first and second electrodes in a common semiconductor device; and a layer of electrode dielectric material positioned on the surface of the substrate between the substrate and the first nonconductive side wall spacer, and the substrate and at least one of the first and second electrode materials, whereby the first and second electrode materials are positioned on differing thicknesses of electrode dielectric material, with the first electrode material being positioned over a thinner section of electrode dielectric material than the second electrode, for requiring a larger activating voltage for the second electrode than the first electrode.

2. An electrode structure for semiconductor devices as claimed in claim 1 wherein each of the first and second electrode materials are positioned on first and second layers of electrode dielectric material, respectively, and the first and second layers of electrode dielectric material have different thicknesses.

3. An electrode structure for semiconductor devices as claimed in claim 1 wherein the first and second electrode materials are each selected to form one of a Schottky gate and an MOS gate.

4. An electrode structure for semiconductor devices as claimed in claim 1 including in addition a second nonconductive side wall spacer formed on the third side wall and defining a fourth side wall substantially parallel to and spaced from the third side wall, and a third electrode material formed in overlying relationship to the surface of the substrate and formed on the fourth side wall so as to define a fifth side wall substantially parallel to and spaced from the fourth side wall, the first, second and third electrode materials being connected as first, second and third electrodes in a common semiconductor device.

5. An electrode structure for semiconductor devices as claimed in claim 1 wherein the first nonconductive side wall spacer and the second electrode material formed on the first side wall each have a thickness in a range of approximately 0.1–0.5 microns.

6. An electrode structure for semiconductor devices as claimed in claim 1 wherein the first nonconductive side wall spacer formed on the first side wall includes ferroelectric material.

7. An electrode structure for semiconductor devices as claimed in claim 1 wherein the first nonconductive side wall spacer formed on the first side wall includes ferroelectric material.

8. An electrode structure for a multi-threshold voltage device comprising:

a semiconductor substrate having a surface;

a first layer of dielectric on said surface, said first layer of dielectric having a first thickness;

a second layer of dielectric over at least a portion of said first layer of dielectric, a first electrode material positioned on said first layer of dielectric in overlying relationship on the surface of the substrate and defining a first side wall substantially perpendicular to the surface of the substrate;

a first nonconductive side wall spacer formed over at least one of said first or second dielectric layers, on said first side wall, and defining a second side wall substantially parallel to and spaced from the first side wall;

a second electrode material positioned on said second layer of dielectric in overlying relationship to the surface of the substrate and formed on the second side wall so as to define a third side wall substantially parallel to and spaced from the second wall, the first and second electrode materials being electrically connected as first and second electrodes in a common semiconductor device; and wherein during operation a different activating voltage for said second electrode is needed than for the first electrode.

9. An electrode structure for semiconductor devices as claimed in claim 8 wherein the first and second electrode materials are each selected to form one of a Schottky gate and a MOS gate.

10. An electrode structure for semiconductor devices as claimed in claim 8 further comprising a second nonconductive side wall spacer formed on the third side wall and defining a fourth side wall substantially parallel to and spaced from the third side wall, and a third electrode material formed in overlying relationship to the surface of the substrate and formed on the fourth side wall so as to define a fifth side wall substantially parallel to and spaced from the fourth side wall, the first, second and third electrode materials being connected electrically as first, second and third electrodes in a common semiconductor device.

11. An electrode structure for semiconductor devices as claimed in claim 8 wherein the first nonconductive side wall spacer and the second electrode material formed on the first side wall each have a thickness in a range of approximately 0.1–0.5 microns.

12. An electrode structure for semiconductor devices as claimed in claim 8, wherein the second layer of electrode dielectric material is positioned on the surface of the first layer of electrode dielectric material.

* * * * *